United States Patent
Vaufrey et al.

(10) Patent No.: US 8,735,879 B2
(45) Date of Patent: May 27, 2014

(54) ORGANIC LIGHT-EMITTING DIODE COMPRISING AT LEAST TWO ELECTROLUMINESCENT LAYERS

(75) Inventors: David Vaufrey, Grenoble (FR); Frédéric Sermet, Saint Jean de Moirans (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/639,588

(22) PCT Filed: Apr. 4, 2011

(86) PCT No.: PCT/IB2011/051438
§ 371 (c)(1),
(2), (4) Date: Nov. 1, 2012

(87) PCT Pub. No.: WO2011/125018
PCT Pub. Date: Oct. 13, 2011

(65) Prior Publication Data
US 2013/0048973 A1 Feb. 28, 2013

(30) Foreign Application Priority Data
Apr. 6, 2010 (FR) .................................... 10 01423

(51) Int. Cl.
*H01L 29/08* (2006.01)
*H01L 35/24* (2006.01)
*H01L 51/00* (2006.01)

(52) U.S. Cl.
USPC .............. 257/40; 257/E33.054; 257/E33.061; 257/E51.018; 257/E51.026

(58) Field of Classification Search
USPC ............. 257/40, E33.054, E33.061, E51.018, 257/E51.026
See application file for complete search history.

(56) References Cited

U.S. PATENT DOCUMENTS

| | | | | |
|---|---|---|---|---|
| 5,581,150 A | * | 12/1996 | Rack et al. | 313/509 |
| 5,683,823 A | * | 11/1997 | Shi et al. | 428/690 |
| 5,773,929 A | * | 6/1998 | Shi et al. | 313/504 |

(Continued)

FOREIGN PATENT DOCUMENTS

| | | |
|---|---|---|
| DE | 10 2007 058005 | 2/2009 |
| EP | 1784056 | 5/2007 |
| EP | 1936714 | 6/2008 |

OTHER PUBLICATIONS

Khalifa, et al.; "Efficient red phosphorescent organic light emitting diodes with double emission layers;" J. Phys. D: Appl. Phys., vol. 41, No. 15; dated Jul. 17, 2008.

(Continued)

*Primary Examiner* — Ida M. Soward
(74) *Attorney, Agent, or Firm* — Alston & Bird LLP

(57) ABSTRACT

The invention provides an organic light-emitting diode which includes at least two electroluminescent layers (ELR, ELB), both of which are fluorescent or phosphorescent and emit at different wavelengths, as well as a hole- and electron-conducting buffer layer (T) arranged between the electroluminescent layers. The buffer layer is a bi-layer having an electron-transport layer (T2) and a hole-transport layer (T1), each one of the hole- and electron-transport layers being made of one or more materials in which the HOMO level(s) are comprised between or equal to the HOMO levels of the electroluminescent layers, and in which the LUMO levels are between or equal to the LUMO levels of said electroluminescent layers, with a tolerance of 0.3 eV.

5 Claims, 2 Drawing Sheets

(56) References Cited

U.S. PATENT DOCUMENTS

| | | | | |
|---|---|---|---|---|
| 6,166,488 | A * | 12/2000 | Arai | 313/504 |
| 6,551,725 | B2 * | 4/2003 | Raychaudhuri et al. | 428/690 |
| 7,115,351 | B2 * | 10/2006 | Kishimoto | 430/199 |
| 7,695,758 | B2 * | 4/2010 | Che et al. | 427/66 |
| 7,768,194 | B2 * | 8/2010 | Forrest et al. | 313/504 |
| 7,911,134 | B2 * | 3/2011 | Prakash et al. | 313/506 |
| 8,198,638 | B2 * | 6/2012 | MacElwee et al. | 257/79 |
| 8,242,489 | B2 * | 8/2012 | Kondakova et al. | 257/40 |
| 8,476,620 | B2 * | 7/2013 | Dobbs et al. | 257/40 |
| 2002/0027416 | A1 | 3/2002 | Kim | |
| 2004/0004433 | A1 * | 1/2004 | Lamansky et al. | 313/506 |
| 2004/0150352 | A1 * | 8/2004 | Koide et al. | 315/169.3 |
| 2005/0025992 | A1 * | 2/2005 | Richter et al. | 428/690 |
| 2007/0046189 | A1 * | 3/2007 | Hatwar et al. | 313/506 |
| 2008/0020669 | A1 * | 1/2008 | Feehery et al. | 445/58 |
| 2009/0001875 | A1 | 1/2009 | Chi et al. | |
| 2009/0091250 | A1 | 4/2009 | Yasukawa et al. | |
| 2009/0167158 | A1 * | 7/2009 | Kathirgamanathan et al. | 313/504 |
| 2010/0032687 | A1 * | 2/2010 | Calder et al. | 257/79 |
| 2010/0314648 | A1 | 12/2010 | Fehrer | |
| 2011/0127501 | A1 * | 6/2011 | Lecloux et al. | 257/40 |
| 2012/0007068 | A1 * | 1/2012 | Smith et al. | 257/40 |

OTHER PUBLICATIONS

Kim, et al.; "Bright small molecular white organic light-emitting devices with two emission zones;" Appl. Phys. Lett., vol. 80, No. 12; pp. 2201-2203; dated Jan. 29, 2002; retrieved Nov. 1, 2012; http://scitation.aip.org/getpdf/servlet/GetPDFServlet?filetype=pdf&id=APPLAB000080000012002201000001&idtype=cvips&doi=10.1063/1.1464223&prog=normal.

Kim, et al.; "High efficiency phosphorescent organic light-emitting diodes using carbazole-type triplet exciton blocking layer;" Appl. Phys. Lett., vol. 90; dated May 31, 2007; retrieved Nov. 1, 2012; http://scitation.aip.org/getpdf/servlet/GetPDFServlet?filetype=pdf&id—APPLAB000090000022223505000001&idtype=cvips&doi=10.1063/1.2742788&prog=normal.

International Search Report and Written Opinion of the International Searching Authority for Application No. PCT/IB2011/051438, dated Apr. 4, 2011.

\* cited by examiner

ORGANIC LIGHT-EMITTING DIODE COMPRISING AT LEAST TWO ELECTROLUMINESCENT LAYERS

FIELD

The invention pertains to an organic light-emitting diode comprising at least two electroluminescent layers, and notably to such a diode emitting a white light.

BACKGROUND

The color white is defined by the International Commission on Illumination (CIE).

Organic light-emitting diodes (known by the acronym "OLED") are fast-developing optoelectronic components.

Whereas a "conventional" light-emitting diode consists of inorganic semi-conducting materials, an OLED consists of a stack of layers of organic materials, among which is included at least one electroluminescent, fluorescent or phosphorescent layer. This results in a fabrication technology which is much simpler and less expensive to implement.

OLEDs emitting a white light can find application in domestic lighting and in the back-lighting of flat screens (liquid-crystal or filtered screens).

To generate a white light it is necessary to combine at least two emitters of different colors. Consequently, white OLEDs comprise at least two distinct electroluminescent layers, exhibiting two different emission wavelengths, or else a single layer containing a mixture of two electroluminescent materials also exhibiting two different emission wavelengths.

FIG. 1 shows a flat band diagram of a white OLED with two spatially separate fluorescent emitters. Depicted from left to right are an anode A, a hole-transport layer HTL, a red electroluminescent layer ELR, a blue electroluminescent layer ELB, an electron-transport layer ETL and a cathode C. The rectangles represent the forbidden bands of the various materials, lying between the HOMO ("highest occupied molecular orbital") and LUMO ("lowest unoccupied molecular orbital") levels. The electroluminescent layers are composed of a matrix and of a fluorescent dopant; the dashed lines represent the HOMO and LUMO levels of the dopants, the continuous lines those of the matrices. The reference NV indicates the level in vacuo.

The chromatic coordinates of the two emitters must be situated, in a CIE1931 diagram, on two points joined by a segment passing through the region of said diagram corresponding to white (in the case of three or more emitters: the polygon obtained by joining the points representing the emission colors of the emitters must contain at least one portion of the white region of the CIE1931 diagram).

However, the emission spectrum of a white light source that is to be used as lighting is not characterized satisfactorily by just the coordinates of the corresponding point in the CIE1931 chromatic space. It is also necessary to take account of a parameter known as the color rendering index (CRI). A satisfactory CRI requires that white be formed on the basis of emitters whose representative points in the CIE1931 diagram are very remote. In particular, at least one of these emitters must generate a light exhibiting a very saturated color. Generally, this entails the blue emitter, thereby making it possible to minimize its proportion of luminance while ensuring emission exhibiting the desired chromatic coordinates. This choice makes it possible to limit the electrical stress imposed on the blue organic emitters, which exhibit a smaller lifetime than those emitting light of greater wavelength and thus constitute the factor which limits the lifetime of white OLEDs.

However, it is also necessary to consider that, for one and the same luminance level, the wider the forbidden band of the blue emitters, and therefore the more saturated the blue color of the light they emit, the shorter their lifetime. Consequently it is necessary to find a compromise, not always satisfactory, between CRI and lifetime.

"Blue" emitters or emitters "with wide forbidden band" mean electroluminescent materials exhibiting a forbidden band lying, by way of indication, between 2.48 and 3.26 eV, corresponding to emission wavelengths of between 380 and 500 nm. In a manner known per se, these materials generally consist of a non-luminescent matrix (or host material) containing a fluorescent or phosphorescent dopant. When one speaks of the forbidden band of an emitter, one is referring to the dopant; the forbidden band of the matrix is slightly wider.

The lifetime of an organic material with wide forbidden band is limited by several physical and physicochemical phenomena.

Firstly, these materials oxidize easily on account of their LUMO level being close to the void level.

Secondly, numerous blue emitters are stable in an ionic form and deteriorate rapidly in the ionic form of opposite sign. Thus, these materials need to be used to conduct electrons mainly (case of FIG. 1), or holes mainly; the presence of minority carriers or of excitons (this being necessary to produce light emission) causes a degradation of electrochemical nature.

Thirdly, it is known empirically that these materials conduct carriers relatively poorly, and therefore undergo significant electrical stress.

These phenomena, which lead firstly to a progressive decrease in luminance over time, and then to a failure of the diode, also occur when blue emitters are used alone (in blue OLEDs), but in this case it is possible to compensate for them, at least up to a certain point, through a progressive increase in the supply voltage. On the other hand, in the case of intimate association of two or more emitters, the difference in their lifetimes causes a progressive and difficult-to-compensate modification of the color point, that is to say of the chromatic coordinates of the emitted light.

Furthermore, in the case of intimate association of two or more emitters, the excitons generated in the emitter of large forbidden band ELB have a tendency to diffuse toward the emitter of smaller forbidden band ELR, reducing the luminance of the blue emitter ELB, which must therefore be subjected to a higher electrical stress.

These problems are not solely specific to white OLEDs, but affect all OLEDs comprising a blue emitter associated with an emitter of narrower forbidden band.

It is known to separate the electroluminescent layers of a white OLED (more generally, with two or more emitters) with an electron-blocking and/or hole-blocking layer intended to control the color point by modifying the distribution of the carriers in the device. A blocking layer is defined by a less (more) energetic LUMO (HOMO) level than the LUMO (HOMO) level of the adjacent layer on the cathode (anode) side when dealing with an electron-blocking (hole-blocking) layer. A barrier height or difference of electronic level is considered to have a blocking effect provided that it is greater than 0.3 eV. This solution is described in the article by CH. Kim and J. Shinar "Bright small molecular white organic light-emitting devices with two emission zones" Appl. Phys. Lett., Vol 80, no. 12 (2002) pp 2201-2203. It exhibits the drawback of reducing the conductivity of the diode, since precisely the blocking layer constitutes a barrier to the transport of the carriers. Consequently, at equal luminance, a higher potential difference must be applied across the terminals of the OLED, thereby limiting the gain in terms of lifetime.

It is also known from the prior art to form the emitter layer as two adjacent sub-layers of distinct host materials doped with the same electroluminescent dopant, the whole being dubbed D-EML for Double Emissive Layer (M. Ben Khalifa et al. "Efficient red phosphorescent organic light emitting diodes with double emission layers", J. Phys. D: Appl. Phys. 41 (2008) 155111). This organic junction exhibits the advantage of associating a hole-conducting host on the anode side and an electron-conducting host on the cathode side. Thus the carrier recombination zone is situated at this junction, and limits the diffusion of the excitons toward adjacent layers external to the D-EML. However, it is very difficult, or even impossible, to apply this solution in the case of a diode associating two or more emitters, since this makes it necessary to considerably increase the number of evaporated layers (4 for two emitters and 6 for three), and on the other hand since the sub-layers in contact of the two or three D-EMLs must ensure non-negligible conductivity both for the holes and for the electrons.

It is also known from the prior art to introduce an exciton blocking layer provided that fluorescent and phosphorescent emitters are associated in one and the same diode. See the article by Sung Hyun Kim, Jyongsik Jang and Jun Yeob Lee "High efficiency phosphorescent organic light-emitting diodes using carbazole-type triplet exciton blocking layer" Applied Physics Letters 90, 223505, 2007. Indeed, phosphorescent emitters are beneficial for low-luminance applications, where they exhibit very high efficiencies. But as there is currently no phosphorescent emitter with wide forbidden band exhibiting a sufficient lifetime, it is not possible to produce an entirely phosphorescent white light-emitting diode. Hence the benefit of associating a blue fluorescent emitter and a phosphorescent emitter with greater wavelength. However, if the precaution were not taken of separating the phosphorescent emitter and the fluorescent emitter with an exciton blocking layer and these two emitters were directly juxtaposed, the triplet excitons of the phosphorescent material could diffuse toward the fluorescent material, where they would de-excite in a non-radiative manner. An exciton blocking layer typically exhibits a thickness of 3-10 nm, and a LUMO (HOMO) level which is lower (higher) than that of the dopant of the phosphorescent emitter. The exciton blocking layer, likewise, reduces the conductivity of the OLED, necessitating the use of a high operating voltage which has an unfavorable effect on the lifetime of the emitters.

The documents EP 1 784 056 and EP 1 936 714 disclose OLEDs exhibiting a plurality of electroluminescent layers separated by intermediate exciton blocking layers. The electroluminescent layers consist of one and the same host material containing various dopants; the intermediate layers consist of this same host material, but without doping. As explained above, the exciton blocking layers reduce the conductivity of the OLED, this having an unfavorable effect on the lifetime of the emitters.

The document US 2009/0001875 discloses OLEDs comprising two electroluminescent layers separated by an intermediate hole-conducting layer. Once again, such a configuration can only reduce the conductivity of the OLED, and consequently the lifetime of its emitters.

The documents DE 10 2007 058005 and US 2010/0314648 disclose OLEDs exhibiting three electroluminescent layers separated by two buffer layers, the latter consisting of a mixture of an electron-transporting material and of a hole-transporting material.

SUMMARY

The invention is aimed at overcoming the drawbacks of the prior art so as to increase the lifetime of OLEDs comprising at least two electroluminescent layers of one and the same type emitting at different wavelengths.

In accordance with the invention, this aim is achieved by an organic light-emitting diode comprising at least two electroluminescent layers, both of fluorescent type or of phosphorescent type and emitting at two different wavelengths, as well as an electron-and-hole conducting buffer layer disposed between said electroluminescent layers, characterized in that said buffer layer is a bilayer comprising an electron-transport layer and a hole-transport layer, each of said electron-transport and hole-transport layers consisting of one or more materials whose HOMO level or levels lie between, or are equal to, the HOMO levels of said electroluminescent layers, and whose LUMO levels lie between, or are equal to, the LUMO levels of said electroluminescent layers, this being with a tolerance of 0.3 eV.

The HOMO and LUMO levels are defined in a perfectly rigorous manner for materials consisting of a single chemical species. In the case of layers comprising a matrix and dopants, the HOMO and LUMO levels are defined by extension as being those of the material constituting the matrix. This definition is conventional.

The HOMO and LUMO levels of a material may be calculated by numerical methods or measured by experimental techniques such as photoelectric spectroscopy or cyclic voltametry. It is understood that the energy levels of the various layers constituting an organic light-emitting diode according to the invention must be defined with the aid of one and the same method in order to be able to be inter-compared. However, the choice of the method is immaterial, since only the relationships between various energy levels are significant for the implementation of the invention. In the examples hereinafter, it will be considered that the HOMO and LUMO levels are defined by photoelectric spectroscopy.

Preferably, said buffer layer can conduct, over at least a part of its thickness, both electrons and holes.

Advantageously, said electroluminescent layers can comprise a matrix and an electroluminescent dopant, and the two layers of said bilayer can comprise a matrix of the same composition as that of the closest electroluminescent layer.

Said electroluminescent layers can comprise a matrix and an electroluminescent dopant, and said buffer layer can consist solely of the material or materials of the matrices of said electroluminescent layers, or of one of said electroluminescent layers.

Said buffer layer can exhibit a thickness of between 1 and 10 nm.

One of said electroluminescent layers may be adapted for emitting a blue light. More particularly, said electroluminescent layers may be chosen so as to allow the emission of white light by the diode.

BRIEF DESCRIPTION OF THE DRAWINGS

Other characteristics, details and advantages of the invention will emerge on reading the description offered with reference to the appended drawings given by way of example and which represent, respectively.

DETAILED DESCRIPTION

To increase the lifetime of a white OLED, or more generally an OLED comprising at least two emitter layers, one of which is blue, the invention proposes to insert, between said emitter layers, a buffer layer allowing the transport of electrons and/or holes, and preferably of both types of carriers, at least over a part of its thickness.

Preferably, the thickness of the buffer layer can be between 1 and 10 nm.

Figure 1:
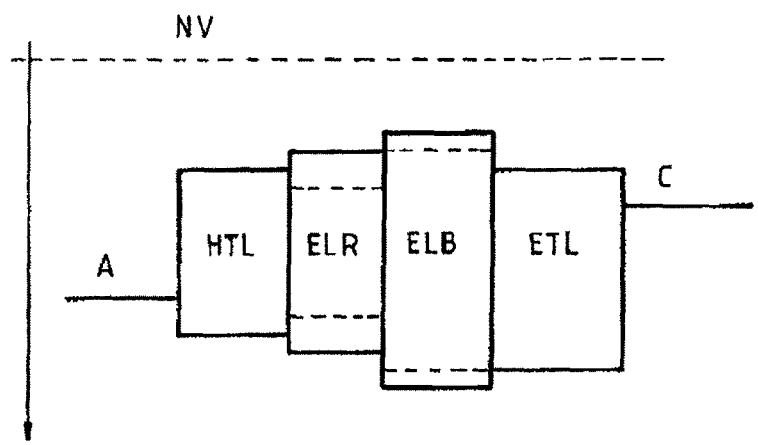
FIG. 1, a flat band diagram of a white OLED according to the prior art.
Figure 2:
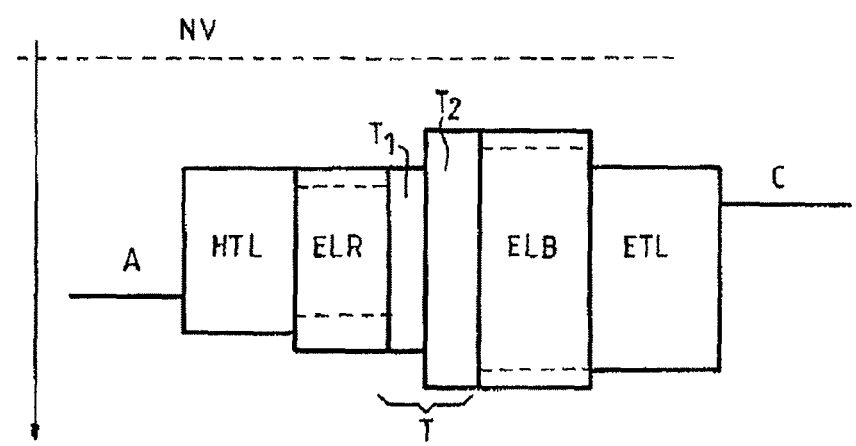
FIG. 2, a flat band diagram of a white OLED according to an embodiment of the invention.
Figure 3:
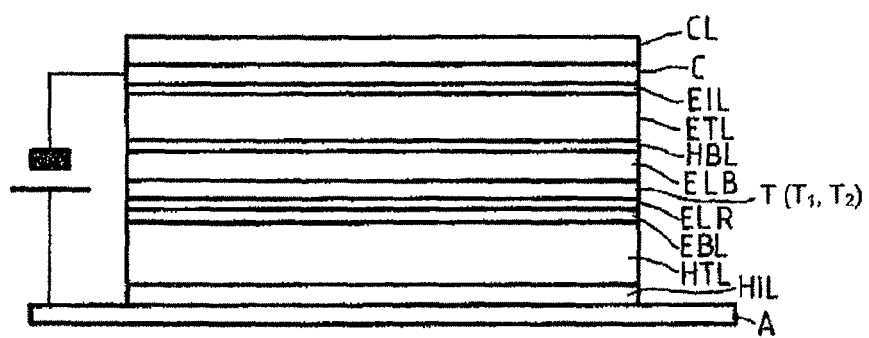
FIG. 3, the structure of an OLED according to an embodiment of the invention.

As illustrated in FIG. 2, this buffer layer T is in fact a bilayer, formed by a first elementary layer $T_1$, conducting holes, and a second elementary layer $T_2$, conducting electrons. In particular, the first elementary layer can consist of the matrix of the red electroluminescent layer ELR (more generally: said electroluminescent layer having a narrow forbidden band), but without dopant; while the second elementary layer can consist of the matrix of the blue electroluminescent layer ELB, also without dopant. The converse is also possible, at least in principle, but there are few blue emitters that conduct holes.

Under these conditions, an exciton generated in one of the emitter layers will diffuse with much greater difficulty toward the second emitter on account of its remoteness. Furthermore, it is understood that the main zone of recombination of the carriers is situated at the interface between the two elementary layers, that is to say in an area which is non-emissive and therefore has no real consequence on the emission and if the materials of this zone deteriorate. This is a considerable advantage with respect to the known embodiments of the prior art, comprising a single buffer layer.

It is generally preferable that the buffer bilayer consist of the same materials which form the matrices of the two emitter layers, but this is not essential. It is therefore possible to produce a buffer bilayer from materials other than those used in the electroluminescent layers. In this case, it will be necessary to take care that this layer does not constitute a carrier blocking layer. Accordingly, it is necessary that the buffer layer consist of materials whose HOMO levels are between, or equal to, the HOMO levels of said electroluminescent layers, and whose LUMO levels are between, or equal to, the HOMO levels of said electroluminescent layers.

The condition on the HOMO and LUMO levels shall not necessarily be satisfied in an exact manner: a tolerance of about 0.3 V is permitted since a barrier of this height is rendered negligible by the thermal agitation of the carriers. Stated otherwise, HOMO or LUMO levels exhibiting an energy difference of less than or equal to 0.3 eV are considered to be "equal" within the meaning of the invention.

In all cases, the use of the buffer layer makes it possible to limit both the diffusion of excitons and the formation of unstable ions that are liable to rapidly degrade the OLED.

As the buffer layer is not an exciton blocking layer, the diode of the invention need not associate a fluorescent emitter and a phosphorescent emitter. The two emitters separated by the buffer layer must exhibit an electroluminescence of the same type.

As shown by FIG. 4 (which is not to scale), an OLED according to the invention typically takes the form of a stack of layers:

An anode A, which may be made for example of AlCu/TiN, Cr, Mo, W, AlCu/W, AlCu/Mo, Ag, ITO (indium-tin oxide) or of some other conducting transparent oxide.

An optional hole injection layer HIL, which may be made, for example, of CuPc, Pedot, or Pani.

A hole-transport layer HTL, optionally doped to increase its conductivity and facilitate the injection of carriers without needing to use an HIL, for example made of SpiroTTB doped with F4TCNQ (1%), or NPB, TPD, Spiro TAD, etc. The dopant can also be MoO3.

An optional electron blocking layer EBL, which may be made, for example, of NPB, TPD, alpha NPD.

A first electroluminescent layer ELR (narrow forbidden band), for example of NPB (fluorescent matrix ensuring the transport of holes) doped with Rubrene (fluorescent yellow-green emitter, supplier Aldrich). The matrix can also be TPD; the dopant may also be RD3 (Kodak trade name), YD3 (Kodak trade name), DCM, DCM2, Coumarin, etc.

A buffer layer T, consisting of the matrices of the first and of the second electroluminescent layer, juxtaposed to form a bilayer.

A second electroluminescent layer ELB (wide forbidden band), for example of BH3 (fluorescent matrix ensuring the transport of electrons) doped with BD3 (deep blue fluorescent emitter, supplier Kodak). It is also possible to use DPVBi, SMB13 doped with SEB116 (Merck trade name), Balq, etc.

A hole blocking layer HBL, for example of Alq3, Balq, TPBi, BCP, Bphen, etc.

An electron-transport layer ETL of Bphen or BCP doped with Ca, Cs, $Cs_2CO_3$, etc.

An optional electron injection layer EIL, which may be made of LiF (lithium fluoride).

A cathode C of Al, Mg/Ag, Ca, Ca/Ag, etc.

An optional layer CL making it possible to improve the extraction of light through the cathode and/or the anode ("capping layer") in the case of a diode with emission through the upper or transparent face. This layer may be, for example, of SiO, $MoO_3$, $TeO_2$, ITO, $SnO_2$, $Sb_2O_3$, ZnSe.

A concrete exemplary embodiment of the invention consists of the following stack of layers:

A: AlCu (100 nm)/TiN: 10 nm
HTL: SpiroTTB doped with F4TCNQ (1%):32 nm
ELB: NPB doped with Rubrene (1%):5 nm
$T_1$: NPB:5 nm
$T_2$: BH3:5 nm
ELR: BH3 doped with BD3 (1.5%):12 nm
HBL: Alq3:2 nm
ETL: Bphen doped with Ca (4%):42 nm
C: Ag:15 nm
CL: SiO:25 nm.

An appreciable improvement in lifetime is noted in such a diode with respect to conventional diodes exhibiting the same stack with the exception of the buffer layers. This lifetime, defined as the time after which the luminance is reduced by 50%, is improved by a factor of typically between 5 and 10 for initial luminances of between 400 and 1500 $Cd/m^2$.

GLOSSARY

SpiroTTB: 2,2',7,7'-tetra(N,N-ditolyl)aminospirobifluorene;

F4TCNQ: 7,7,8,8-Tetracyano-2,3,5,6-tetrafluoroquinodimethane;

NPB: N,N'-Bis(naphthalene-1-yl)-N,N'-bis(phenyl)benzidine;

TPD: N,N'-Bis(3-methylphenyl)-N,N'-bis(phenyl)-9,9-dimethylfluorene;

Spiro TAD: (2,2',7,7'-Tetrakis(n,n-diphenylamino)-9,9'-spirobifluorene);

DCM: 4-(Dicyanomethylene)-2-methyl-6-(4-dimethylaminostyryl)-4H-pyran;

DCM2: 4-(Dicyanomethylene)-2-methyl-6-julolidyl-9-enyl-4H-pyran;

Coumarin: 1-benzopyran-2-one;

DPVBi: 4,48-bis(2,28-diphenylvinyl)-1,18-biphenyl;

Balq: Bis-(2-methyl-8-quinolinolate)-4(phenylphenolato)aluminum;

Alq3: Tris-(8-hydroxyquinoline)aluminum;

TPBi: 2,2',2"-(1,3,5-Benzinetriyl)-tris(1-phenyl-1-H-benzimidazole);

BCP: Bathocuproine;

Bphen: 4,7-Diphenyl-1,10-phenanthroline;

Pedot: polyethylenedioxythiophene optionally doped with Polystyrene sulfonate

Pani: Polyaniline;

CuPc: Copper Phthalocyanine ($C_{32}H_{16}N_8Cu$).

Alpha NPD: N,N'-Bis(naphthalene-1-yl)-N,N'-bis(phenyl)-2,2-dimethylbenzidine;

BH3, BD3 and SMB13 are trade names.

The invention claimed is:

1. An organic light-emitting diode comprising at least two electroluminescent layers (ELR, ELB), both of fluorescent type or of phosphorescent type, emitting at two different wavelengths and comprising a matrix and an electroluminescent dopant as well as an electron-and-hole conducting buffer layer (T) disposed between said electroluminescent layers, constituted by a bilayer comprising an electron-transport layer ($T_2$) and a hole-transport layer ($T_1$), characterized in that each of said electron-transport and hole-transport layers comprises a matrix of the same composition as that of the closest electroluminescent layer.

2. The organic light-emitting diode as claimed in claim 1, in which said electroluminescent layers comprise a matrix and an electroluminescent dopant, and in which said buffer layer consists solely of the materials of the matrices of said electroluminescent layers.

3. The organic light-emitting diode as claimed in claim 1, in which said buffer layer exhibits a total thickness of between 1 and 10 nm.

4. The organic light-emitting diode as claimed in claim 1, in which one of said electroluminescent layers is adapted for emitting a blue light.

5. The organic light-emitting diode as claimed in claim 1, in which said electroluminescent layers are chosen so as to allow the emission of white light by the diode.

* * * * *